(12) United States Patent
Potucek et al.

(10) Patent No.: US 9,392,711 B2
(45) Date of Patent: Jul. 12, 2016

(54) ELECTRICAL JUNCTION BOX WITH BUILT-IN ISOLATION TRANSFORMER

(71) Applicant: Hayward Industries, Inc., Elizabeth, NJ (US)

(72) Inventors: Kevin Potucek, Elizabeth, NJ (US); James Carter, North Kingston, RI (US); Gregory Fournier, North Kingston, RI (US)

(73) Assignee: Hayward Industries, Inc., Elizabeth, NJ (US)

( * ) Notice: Subject to any disclaimer, the term of this patent is extended or adjusted under 35 U.S.C. 154(b) by 0 days.

(21) Appl. No.: 13/573,694

(22) Filed: Oct. 3, 2012

(65) Prior Publication Data

US 2014/0090865 A1    Apr. 3, 2014

(51) Int. Cl.
*H05K 5/06* (2006.01)
*H02G 3/08* (2006.01)

(52) U.S. Cl.
CPC ............... *H05K 5/061* (2013.01); *H02G 3/081* (2013.01); *H02G 3/088* (2013.01)

(58) Field of Classification Search
USPC ....... 439/535; 248/906; 220/4.02; 174/50.51, 174/50, 58
See application file for complete search history.

(56) References Cited

U.S. PATENT DOCUMENTS

| | | | |
|---|---|---|---|
| 2,781,737 A | | 2/1957 | Killman |
| 4,090,230 A | * | 5/1978 | Fuller et al. ................... 361/617 |
| 4,292,661 A | * | 9/1981 | Johnson et al. ............... 361/735 |
| 4,533,786 A | * | 8/1985 | Borgmeyer et al. ........... 174/50 |
| 4,559,699 A | * | 12/1985 | Owen et al. .................. 29/602.1 |

(Continued)

OTHER PUBLICATIONS

Hayward: Coupler for ColorLogic Pool/Spa Lights, Owner's Manual. Copyright 2012 (publically available at least as early as Oct. 3, 2012) (16 pages).

(Continued)

*Primary Examiner* — Dhirubhai R Patel
(74) *Attorney, Agent, or Firm* — McCarter & English, LLP

(57) ABSTRACT

An electrical junction box with a built-in isolation transformer is provided. The junction box includes an interior base portion having at least one opening, a transformer secured to the interior base portion and in electrical communication with low-voltage and high-voltage terminals, a cover configured to attach to a junction box base plate and housing the interior base I portion and the transformer, and a gasket providing a watertight seal between the cover and the junction box base plate.

14 Claims, 18 Drawing Sheets

(56) References Cited

U.S. PATENT DOCUMENTS

| | | | |
|---|---|---|---|
| 4,656,689 A | 4/1987 | Dennis | |
| 4,872,102 A * | 10/1989 | Getter | 363/141 |
| 4,999,757 A | 3/1991 | Poppenheimer | |
| 5,465,199 A | 11/1995 | Bray et al. | |
| 5,556,188 A | 9/1996 | Poppenheimer | |
| 5,607,224 A | 3/1997 | Tobias et al. | |
| 5,789,828 A * | 8/1998 | Tremaine et al. | 307/64 |
| 6,152,571 A | 11/2000 | Ruiz | |
| 6,203,173 B1 | 3/2001 | Duff et al. | |
| 6,241,361 B1 | 6/2001 | Thrasher et al. | |
| 6,940,016 B1 * | 9/2005 | Cornett et al. | 174/58 |
| D536,304 S | 2/2007 | Czyz et al. | |
| D553,093 S | 10/2007 | Miller | |
| 7,705,240 B2 | 4/2010 | Armstrong et al. | |
| 7,855,339 B2 | 12/2010 | Lin et al. | |
| 7,947,903 B2 * | 5/2011 | Peck | 174/66 |
| 2006/0072323 A1 | 4/2006 | Poggi | |
| 2006/0262462 A1 * | 11/2006 | Barton | 361/1 |
| 2008/0112157 A1 | 5/2008 | Boothe et al. | |
| 2009/0195085 A1 | 8/2009 | Joseph | |
| 2014/0092606 A1 | 4/2014 | Potucek et al. | |

OTHER PUBLICATIONS

Office Action dated May 8, 2014 from pending U.S. Appl. No. 13/573,708 (25 pages).

PowerPoint Presentation entitled "Lighting," dated Oct. 3, 2011 (15 pages).

* cited by examiner

US 9,392,711 B2

ELECTRICAL JUNCTION BOX WITH BUILT-IN ISOLATION TRANSFORMER

BACKGROUND OF THE INVENTION

1. Field of the Invention

The present invention relates generally to the field of electrical equipment. More specifically, the present invention relates to an electrical junction box with a built-in isolation transformer.

2. Related Art

Underwater pool lighting is very common, and is popular at a variety of locations, such as commercial and residential pools and spas. Low-voltage (e.g., 12 volt) underwater lighting is especially popular because it is safer than high-voltage lighting. However, due to local and national electrical codes, low-voltage lighting requires installation of an isolation step-down transformer, which typically decreases the voltage provided to the pool lights from 120 volts to 12 volts and electrically isolates high-voltage wiring from low-voltage wiring. For safety reasons, industry regulations require both high-voltage and low-voltage underwater pool lighting to be connected in a waterproof junction box. With high-voltage lighting, the junction box is located above-ground and encloses the connection between the light fixture and the high-voltage supply (e.g., panel board). With low-voltage lighting, the junction box is also above-ground, and encloses the connection between the light fixture and an external transformer.

To replace or "retrofit" high-voltage lighting with low-voltage lighting, a variety of electrical parts and/or tools are required to properly install and connect an isolation transformer and associated wiring. Additionally, installation is often difficult for those with little or no electrical background or experience. Further, an isolation transformer separate from a junction box is generally visually displeasing. Moreover, existing junction boxes cannot easily be retrofit to accept isolation transformers.

Accordingly, what would be desirable is an electrical junction box with a built-in isolation transformer, which addresses the foregoing needs. Also desirable would be a kit, comprising an isolation transformer and new junction box components that may be installed using some or all of the components of the existing, previously-installed junction boxes.

SUMMARY OF THE INVENTION

The present invention relates to an electrical junction box with a built-in isolation transformer. The junction box provides low-voltage electrical power for use in connection with underwater pool or spa lighting, and can easily be attached to and used with existing wiring and/or conduits at pool/spa locations. The junction box comprises a cover including a peripheral flange shaped and sized to receive a base plate of an existing junction box installation, the cover removably attachable to the base plate and defining an interior cavity; a high-voltage section and a low-voltage section defined within the cover, the high-voltage section isolated from the low-voltage section; and a transformer positioned within the cover and in electrical communication with high-voltage terminals and low-voltage terminals, the high-voltage terminals positioned in the high-voltage section and the low-voltage terminals positioned in the low-voltage section. The cover and the base portion could have various shapes, e.g., generally rectangular, square, or oval cross-sectional shapes, to accommodate existing base plates of various sizes/shapes. A second transformer could be attached to the base portion.

BRIEF DESCRIPTION OF THE DRAWINGS

The foregoing features of the invention will be apparent from the following Detailed Description of the Invention, taken in connection with the accompanying drawings, in which.

DETAILED DESCRIPTION OF THE INVENTION

The present invention relates to an electrical junction box with an isolation transformer, as discussed in detail below in connection with FIGS. 1A-8.

Figure 1A:
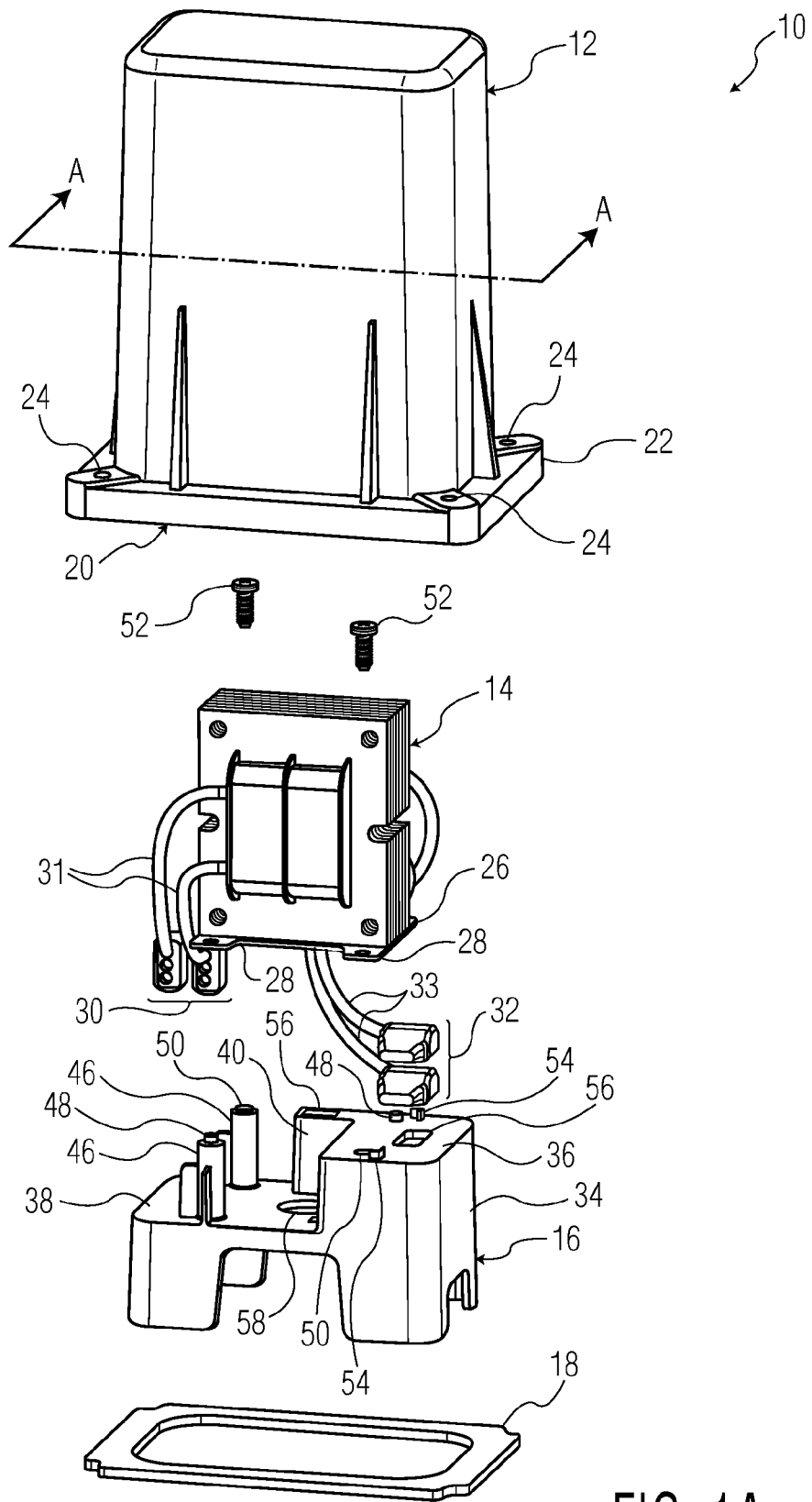
FIG. 1A is an exploded view of the electrical junction box of the present invention, having a generally rectangular shape.

As shown in the exploded view of FIG. 1A, the junction box 10 includes a cover 12, an isolation transformer 14, an interior base portion 16, and a gasket 18. The cover 12 defines a chamber 20 housing the transformer 14 and interior base portion 16 therein, and has a peripheral flange 22 including apertures 24 that receive screws (not shown) for securing the cover 12 to a junction box baseplate, discussed in greater detail below. The transformer 14 is a step-down transformer and steps incoming electricity from a high voltage (e.g., 120 volts) to a lower voltage (e.g., 12 volts) for use by one or more low-voltage pool lighting fixtures (or other electronic devices, such as low-voltage landscaping lights and other types of lighting equipment). The transformer 14 includes tabs 26 having apertures 28, as well as high-voltage terminals 30 and associated wires 31, and low-voltage terminals 32 and associated wires 33. Any suitable transformer could be used consistent with the scope of the present invention.

The interior base portion 16 includes exterior sidewalls 34 which correspond to the shape of the cover 12 and are insertable therein. The interior base portion 16 has an upper top surface 36, a lower top surface 38, and an interior sidewall 40. The interior base portion 16 further includes at least one low-voltage opening 56 and at least one high-voltage opening 58, discussed in further detail below. The interior base portion 16 includes two stand-offs 46 extending from the lower top surface 38 to a height equal to the upper top surface 36. The tabs 26 of the transformer 14 contact the standoffs 46 and the upper top surface 36 of the base 16. To secure the transformer 14 to the interior base portion 16, the stand-offs 46 and upper top surface 36 could include protrusions 48 that extend through the apertures 28 of the tabs 26. Additionally, apertures 50 could be provided which receive screws 52, such that the screws 52 extend through the apertures 28 of the tabs 26 to secure the transformer 14 to the base 26. The protrusions 48 are preferably circularly shaped to correspond to, and engage with, the apertures 28 of the tabs 26 of the transformer 14. The screws 52 could be #8 thread-forming screws sold under the trademark PLASTITE, but any other suitable screw could be used. The upper top surface 36 includes corner protrusions 54 shaped to engage the sides of the tabs 26, further stabilizing and securing the transformer 14 to the interior base portion 16. The corner protrusions 54 could also aid a user in aligning the apertures 28 of the tabs 26 of the transformer 14 with the protrusions 48 and/or apertures 50 of the interior base portion 16.

Figure 1B:
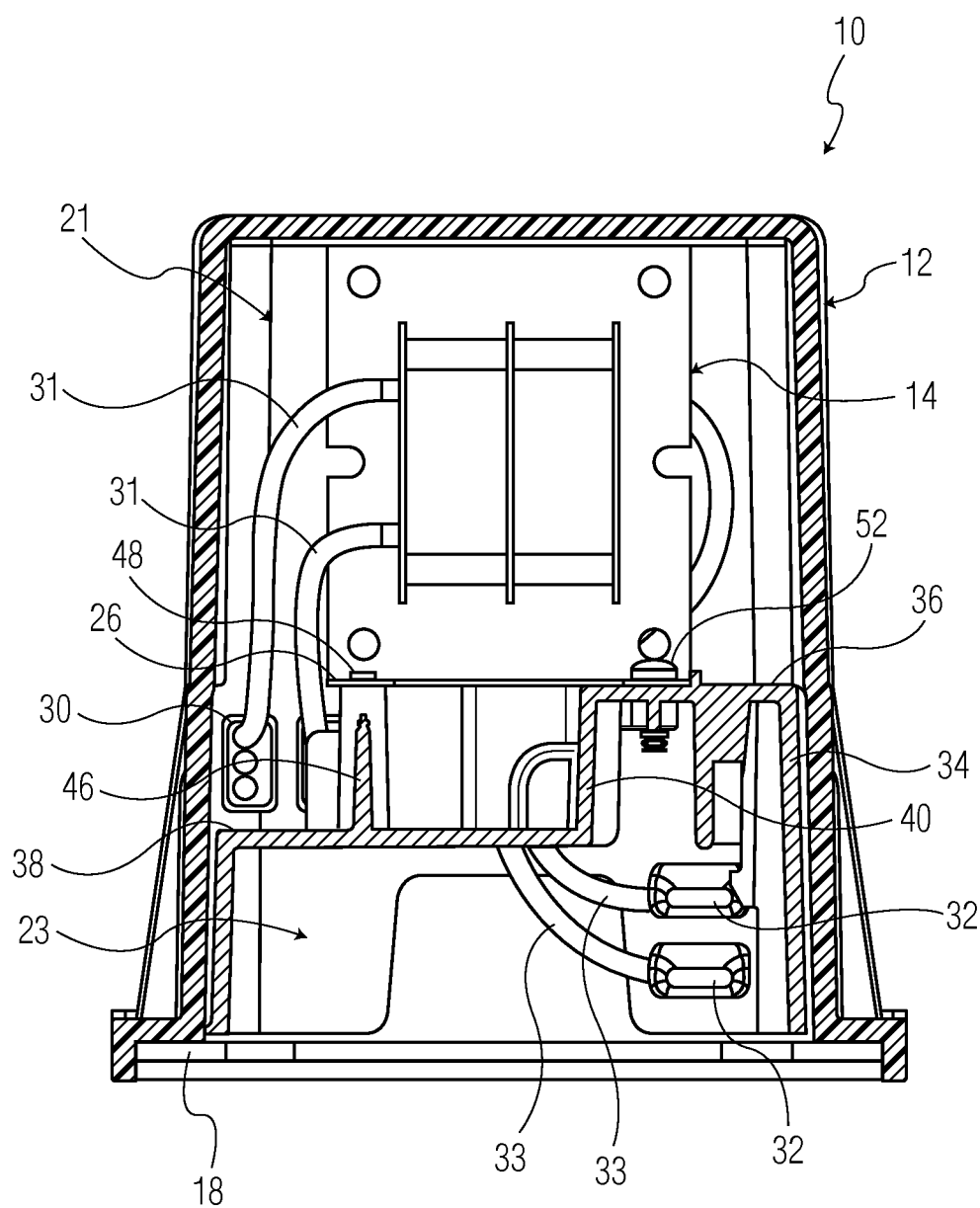
FIG. 1B is a partial cross-sectional view of the electrical junction box taken along line A-A of FIG. 1A.

Referring to FIG. 1B, shown is a partial cross-sectional view of the electrical junction box 10 taken along line A-A of FIG. 1A. As shown, the interior base portion 16 divides the chamber 20 of the cover 12 into an upper, high-voltage section or compartment 21 and a lower, low-voltage section or compartment 23, providing physical and electrical isolation between the two sections. The high-voltage terminals 30 and wires 31 remain with the transformer 14 in the upper section or compartment 21, and the low-voltage terminals 32 of the transformer 14 are fed through the low-voltage opening 56 via wires 33 to the lower section or compartment 23. Thus, the low-voltage terminals 32 and high-voltage terminals 30 are physically and electrically isolated from each other. The lower top surface 38 and the columns 46 together provide sufficient clearance for connecting the high-voltage terminals 30 of the transformer 14 to the high-voltage supply. It is noted that the shape of the interior base portion 16 could be varied as desired. The gasket 18 is received by the flange 22 and creates a watertight seal between the cover 12 and a baseplate to which the cover 12 is mounted.

Figure 1C:
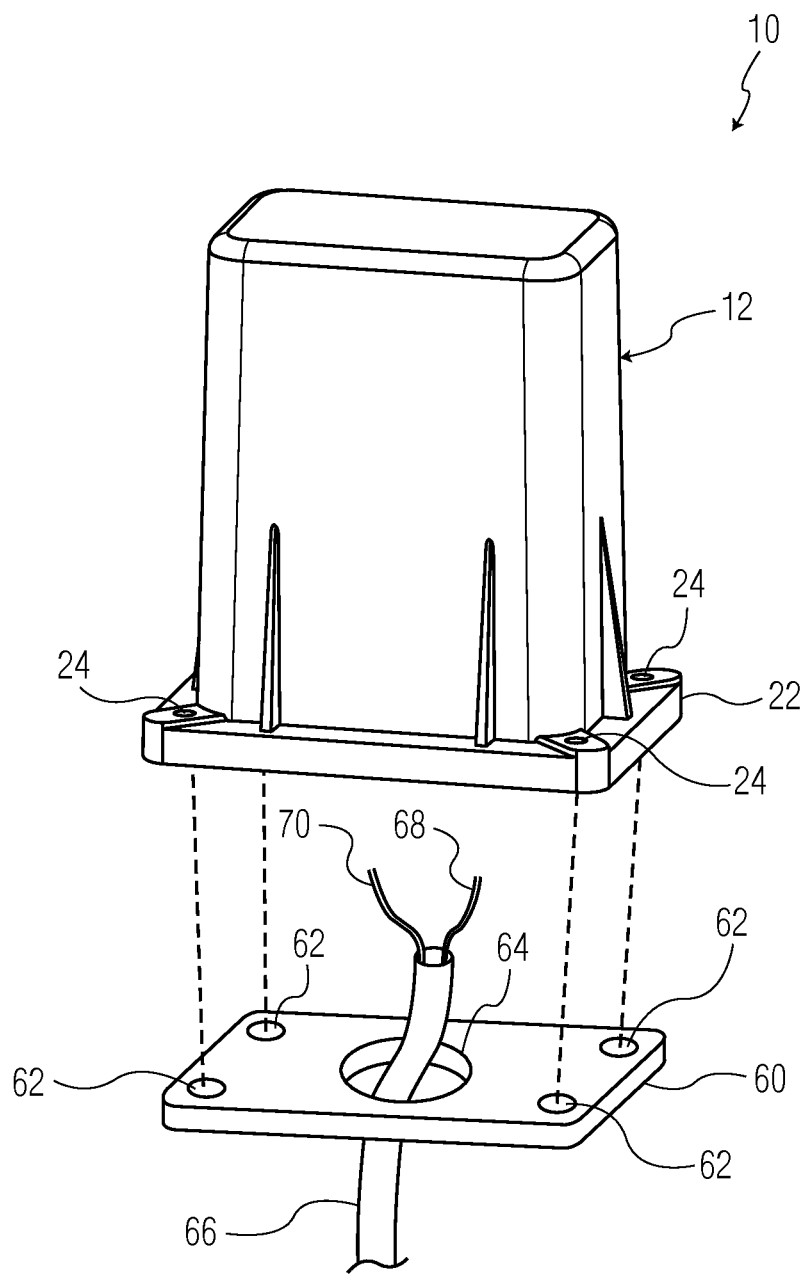
FIG. 1C is an exploded view of the electrical junction box of FIG. 1A, as well as a junction box baseplate and wiring to which the junction box can be attached.
Figure 1D:
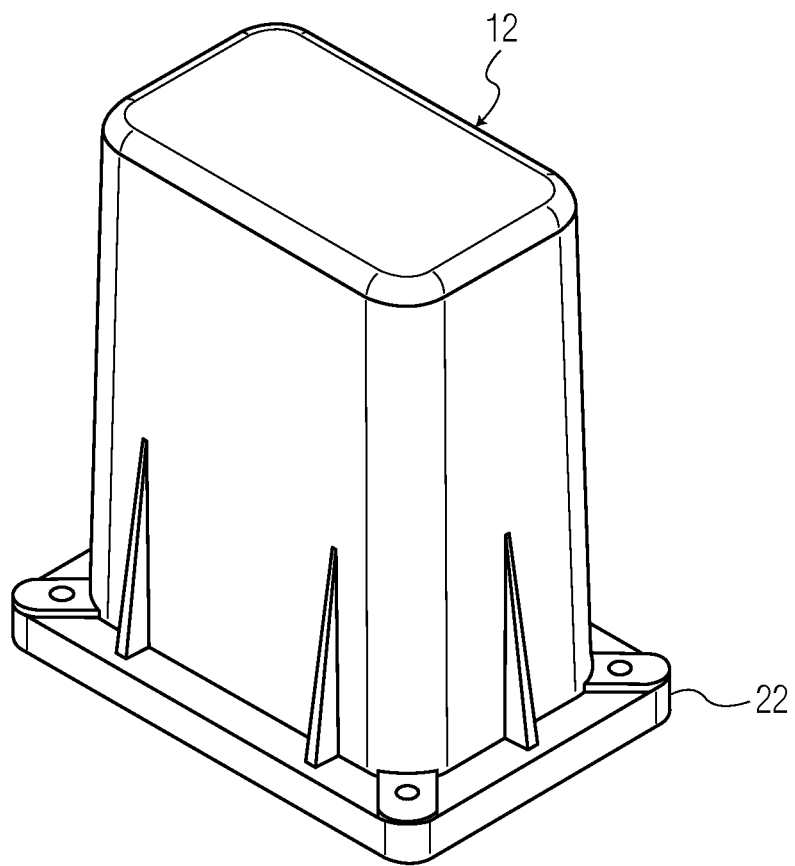
FIGS. 1D-1G are perspective, top, and side views respectively of the electrical junction box of FIG. 1A.
Figure 1E:
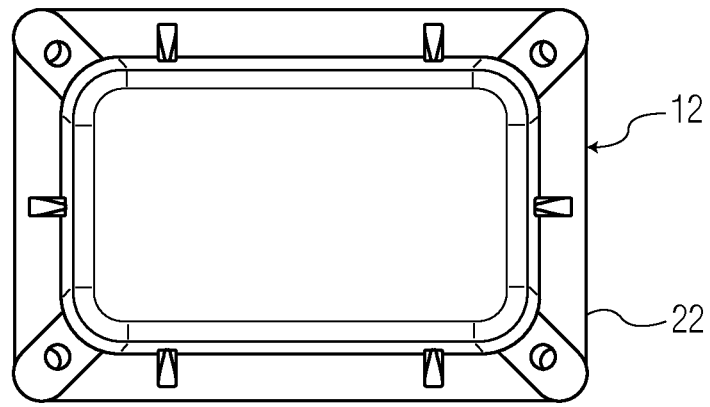
Figure 1F:
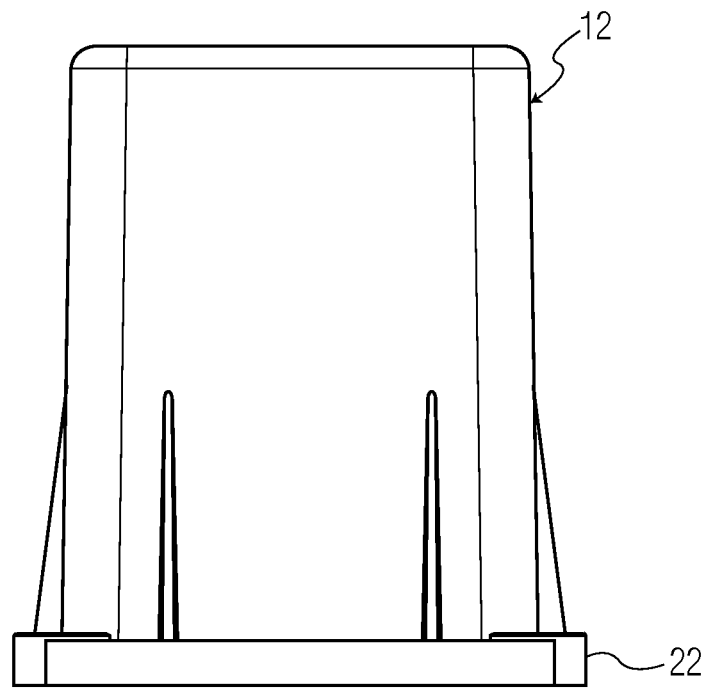
Figure 1G:
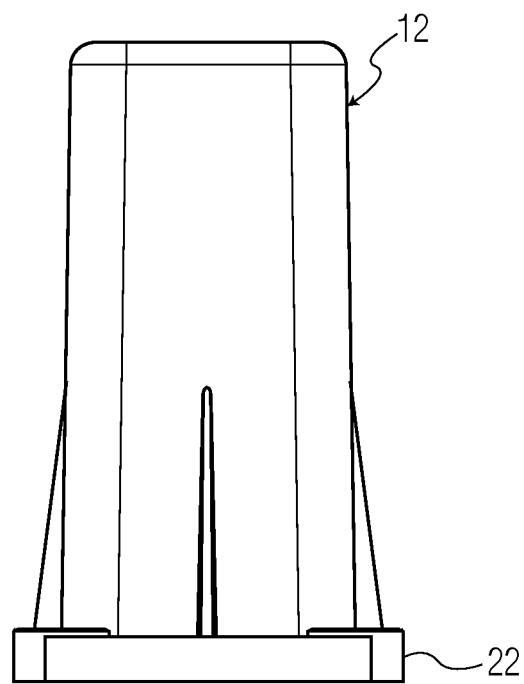

As shown in FIG. 1C, the junction box 10 can be secured to a junction box baseplate 60. Such a baseplate 60 could already exist at a pool/spa location, such that the junction box 10 can be easily attached to the baseplate 60 to provide a quick and convenient "retrofit" solution for providing low-voltage power to underwater pool/spa lights using existing conduit and wiring and obviating the need for separate wiring. The apertures 24 of the cover 12 align with apertures 62 of the junction box baseplate 60, which are preferably threaded screw holes. The gasket 18 (such as those provided by Thermocraft, Inc., Pentair, Inc., or Intermatic, Inc.) is compressed between the junction box baseplate 60 and the cover 12, providing a watertight seal that prevents water infiltration and/or flooding of the junction box 10. The junction box baseplate 60 could be attached to and supported by conduit extending upwardly from the ground, as is commonly found in existing pool/spa locations.

A low-voltage cable 66 connected to a pool light fixture enters the lower section or compartment 23 of the chamber of the junction box attachment 10 via a center hole 64 of the junction box baseplate 60. The center hole 64 could be attached to a rigid conduit (not shown) through which the cable 66 is fed. The conduit 66 includes wires 68, 70 that connect in the lower section or compartment 23 to the low-voltage terminals 32 of the transformer 14. Wiring from a high-voltage supply connects to the high-voltage terminal 30 in the upper section or compartment 21 via the center hole 64 and the high-voltage opening 58 of the interior base portion 16. Such high-voltage wiring could be provided by a separate cable and conduit, not shown.

FIGS. 1D-1G are various exterior views of the cover 12. As shown, the cover 12 has a rectangular cross-sectional shape, and the flange 22 is shaped to accommodate baseplates of existing installations.

Figure 2A:
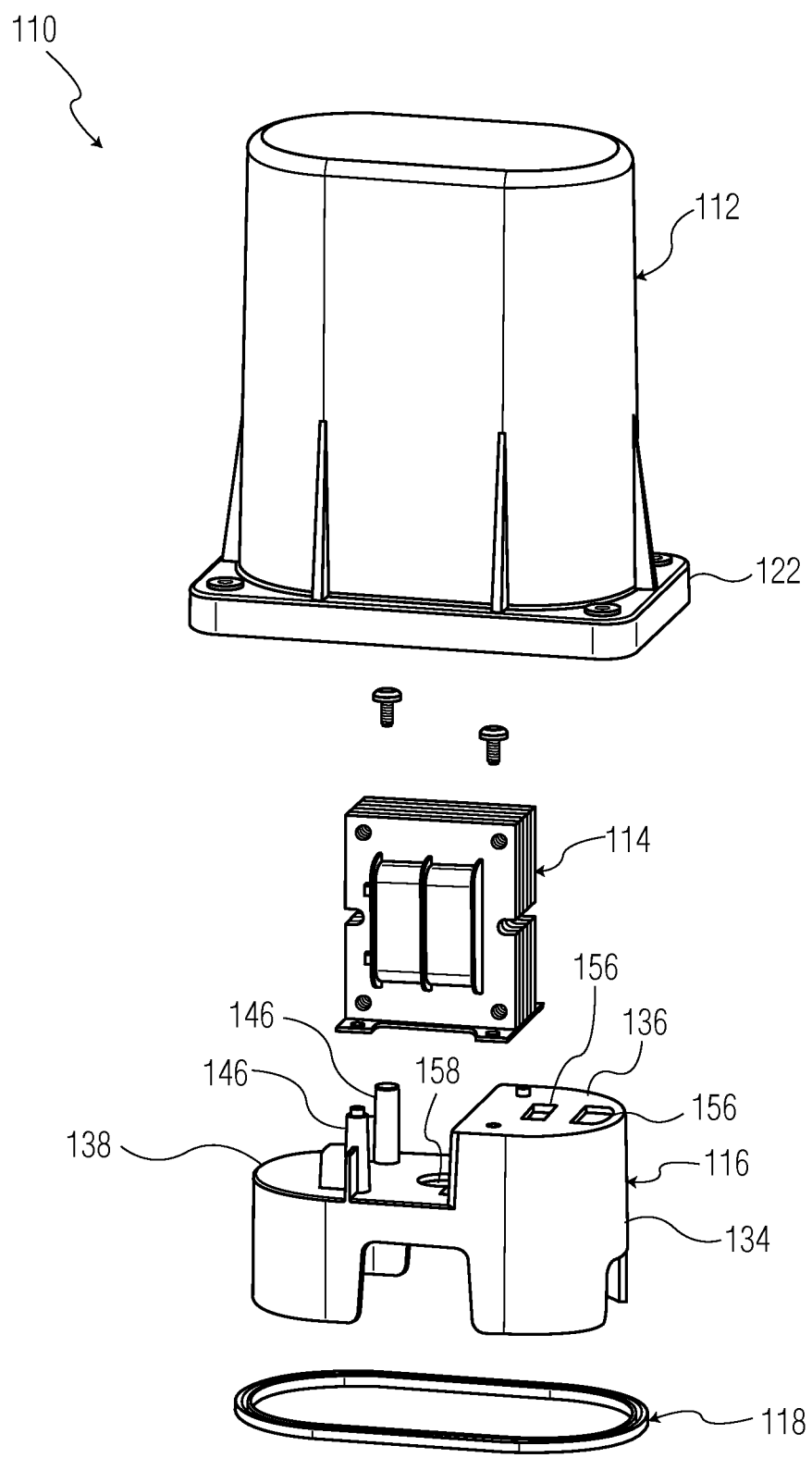
FIG. 2A is an exploded view showing another embodiment of the electrical junction box of the present invention, having a generally oval cross-sectional shape.
Figure 2B:
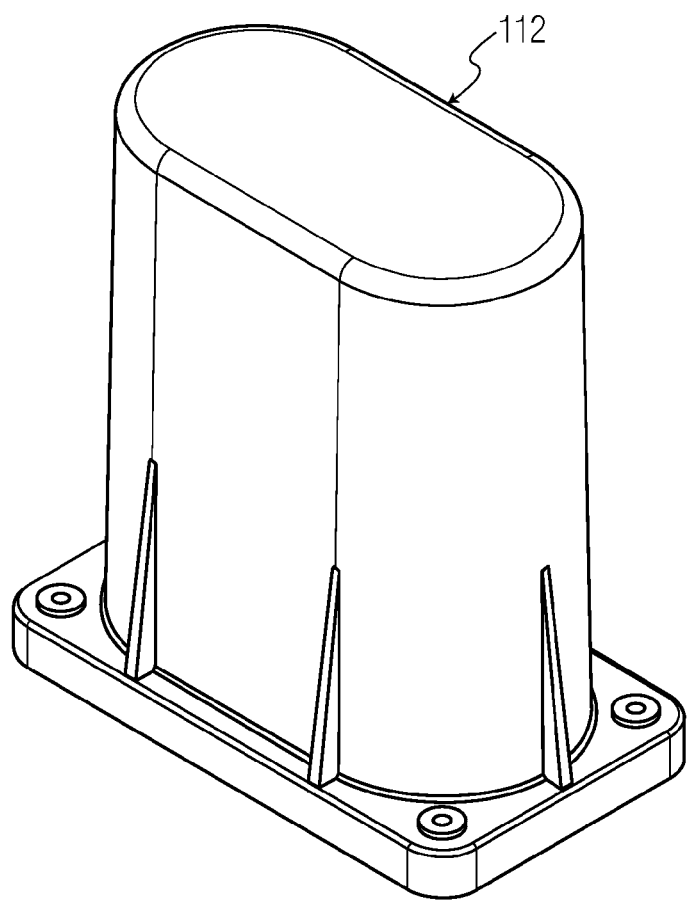
FIGS. 2B-2E are perspective, top, and side views respectively of the electrical junction box of FIG. 2A.
Figure 2C:
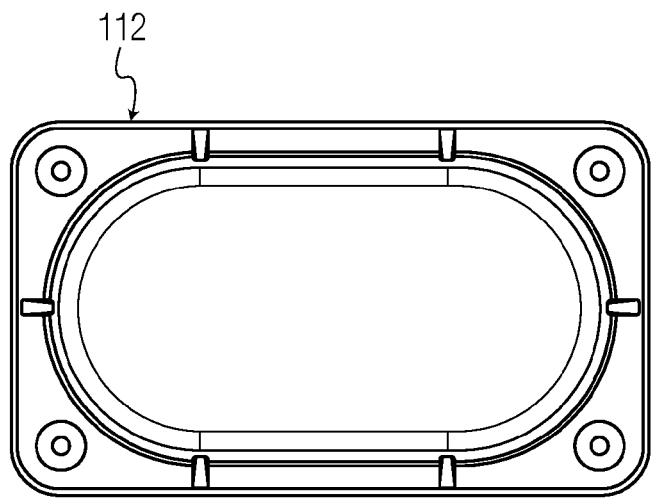
Figure 2D:
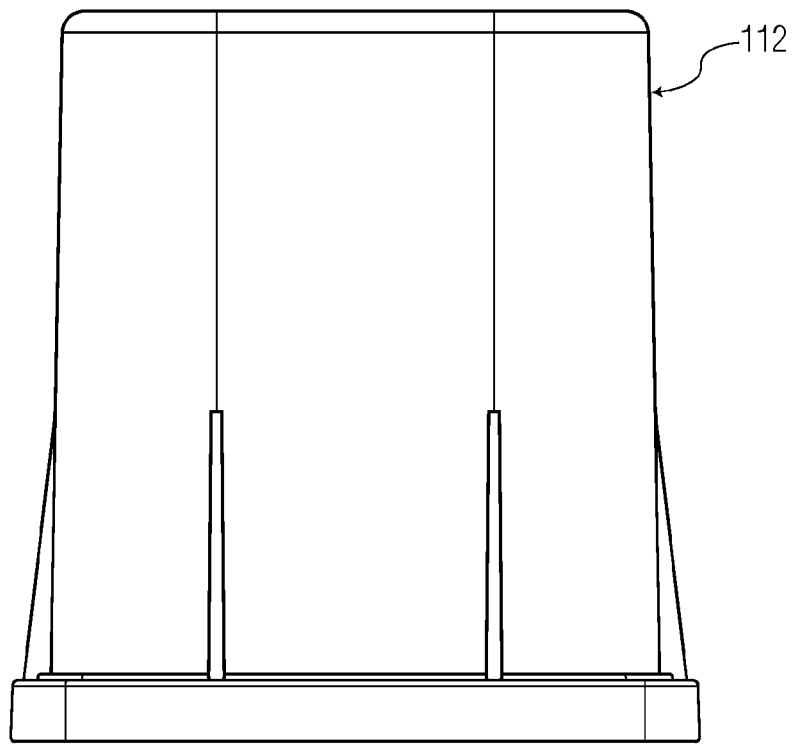
Figure 2E:
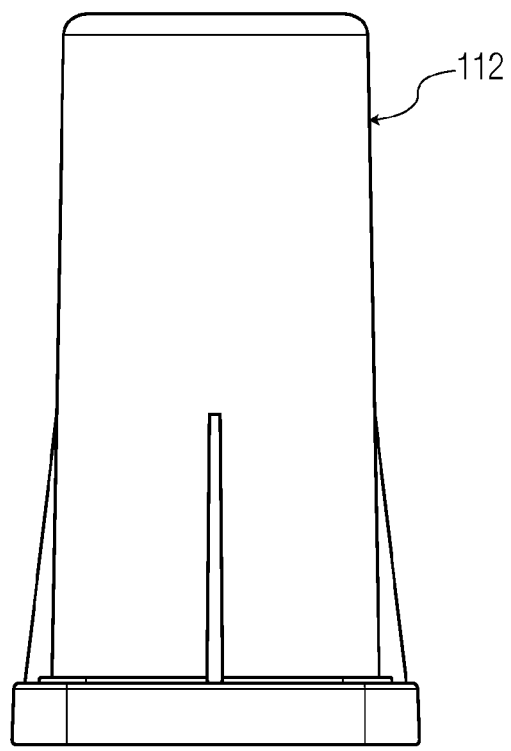

FIG. 2A is an exploded view showing another embodiment of the electrical junction box 110 of the present invention, having a generally oval cross-sectional shape. The junction box 110 includes an oval cover 112 with a rectangular flange 122 for attachment to an existing junction box baseplate. The junction box 110 includes parts identified in the previous embodiment (e.g., cover 112, transformer 114, interior base portion 116, gasket 118, etc.), which are indicated with reference numerals incremented by 100. Although not shown in FIG. 2A, the transformer 114 includes the same high-voltage and low-voltage terminals and wiring shown in FIGS. 1A-1B. The sidewalls 134 of the interior base portion 116 are generally oval in shape, and are received by the oval cover 112. Additionally, the interior base portion 116 includes, as in the previous embodiment, at least one high-voltage opening 158, at least one low-voltage opening 156, an upper top surface 136, a lower top surface 138, and columns 146.

FIGS. 2B-2E are perspective, top, and side views, respectively, of the cover 112 of junction box 110 having a generally oval cross-sectional shape. As can be appreciated the shape of the cover 112 and its associated flange can be varied to accommodate baseplates of various configurations and/or from various manufacturers.

Figure 3A:
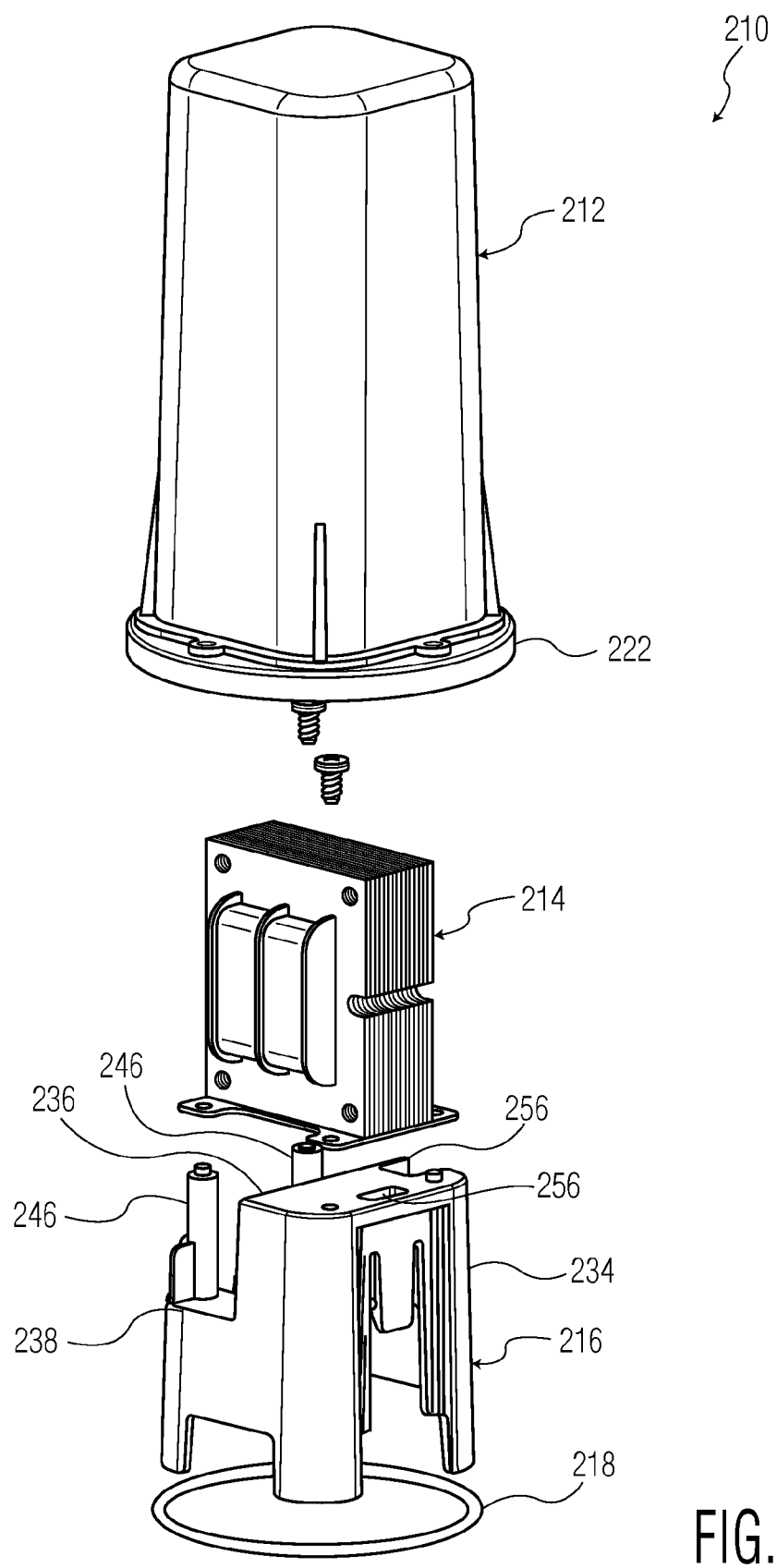
FIG. 3A is an exploded view of another embodiment of the electrical junction box of the present invention, having a generally square cross-sectional shape.
Figure 3B:
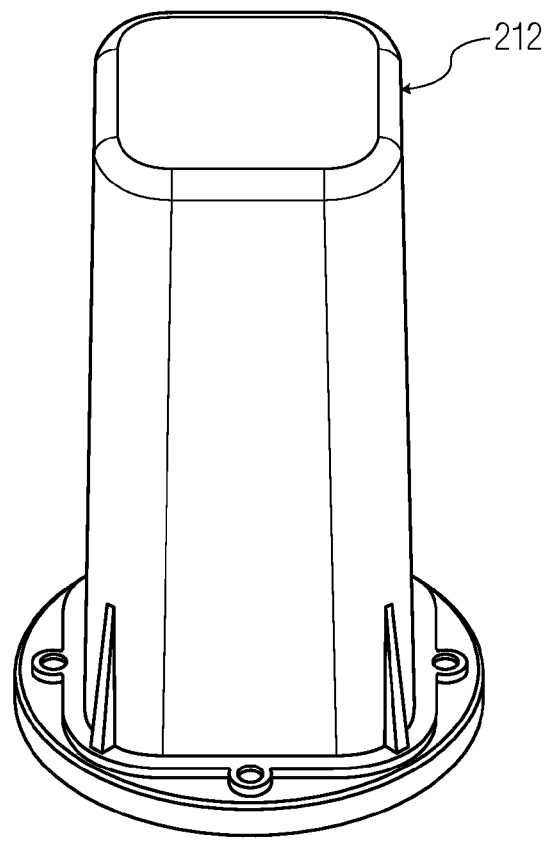
FIGS. 3B-3E are perspective, top, and side views respectively of the electrical junction box of FIG. 3A.
Figure 3C:
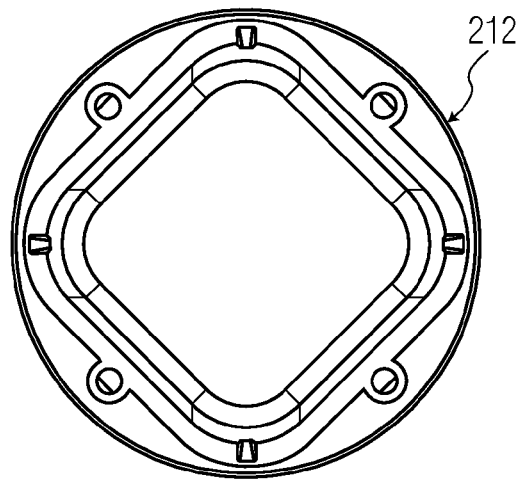
Figure 3D:
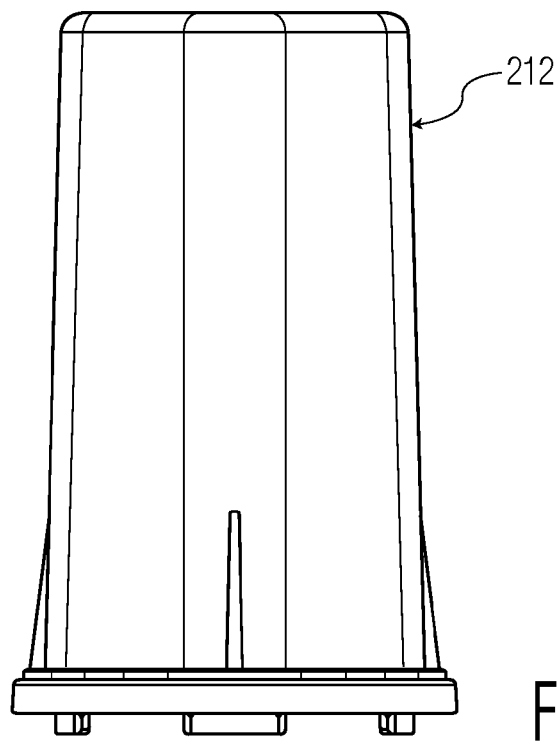
Figure 3E:
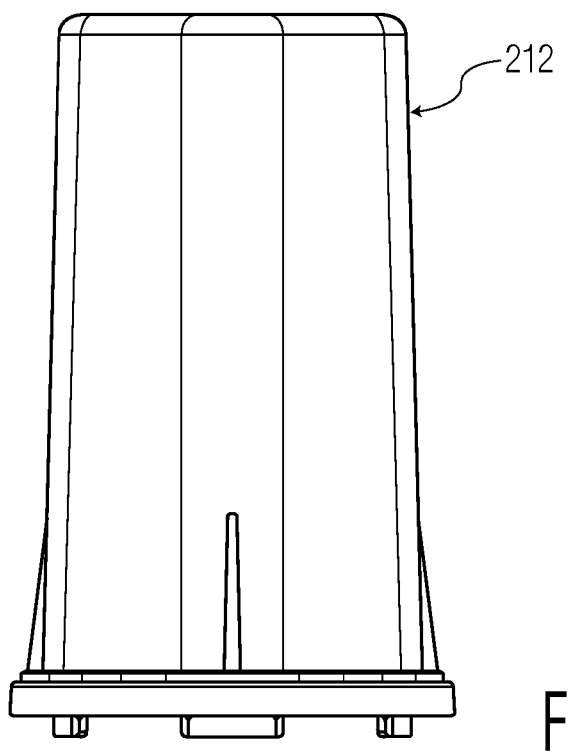

FIG. 3A is an exploded view of another embodiment of the electrical junction box 210 of the present invention, having a generally square cross-sectional shape. The junction box 210 includes a cover 212 having a square cross-section and a circular flange 222 for attachment to an existing junction box baseplate. The junction box 210 includes parts identified in the previous two embodiments (e.g., cover 212, transformer 214, interior base portion 216, and gasket 218), which are indicated with reference numerals incremented by 100. The transformer 214 includes high-voltage and low-voltage terminals and wiring shown in FIGS. 1A-1B. The sidewalls 234 of the interior base portion 216 are shaped to correspond to the square cover 212. Additionally, the interior base portion 216 includes, as in the previous embodiments, at least one high-voltage opening (not visible), at least one low-voltage opening 256, an upper top surface 236, a lower top surface 238, and columns 246.

FIGS. 3B-3E are perspective, top, and side views, respectively, of the cover 212 of junction box 210 having a generally square cross-sectional shape. As can be appreciated the shape of the cover 212 and its associated flange can be varied to accommodate baseplates of various configurations and/or from various manufacturers.

Figure 4A:
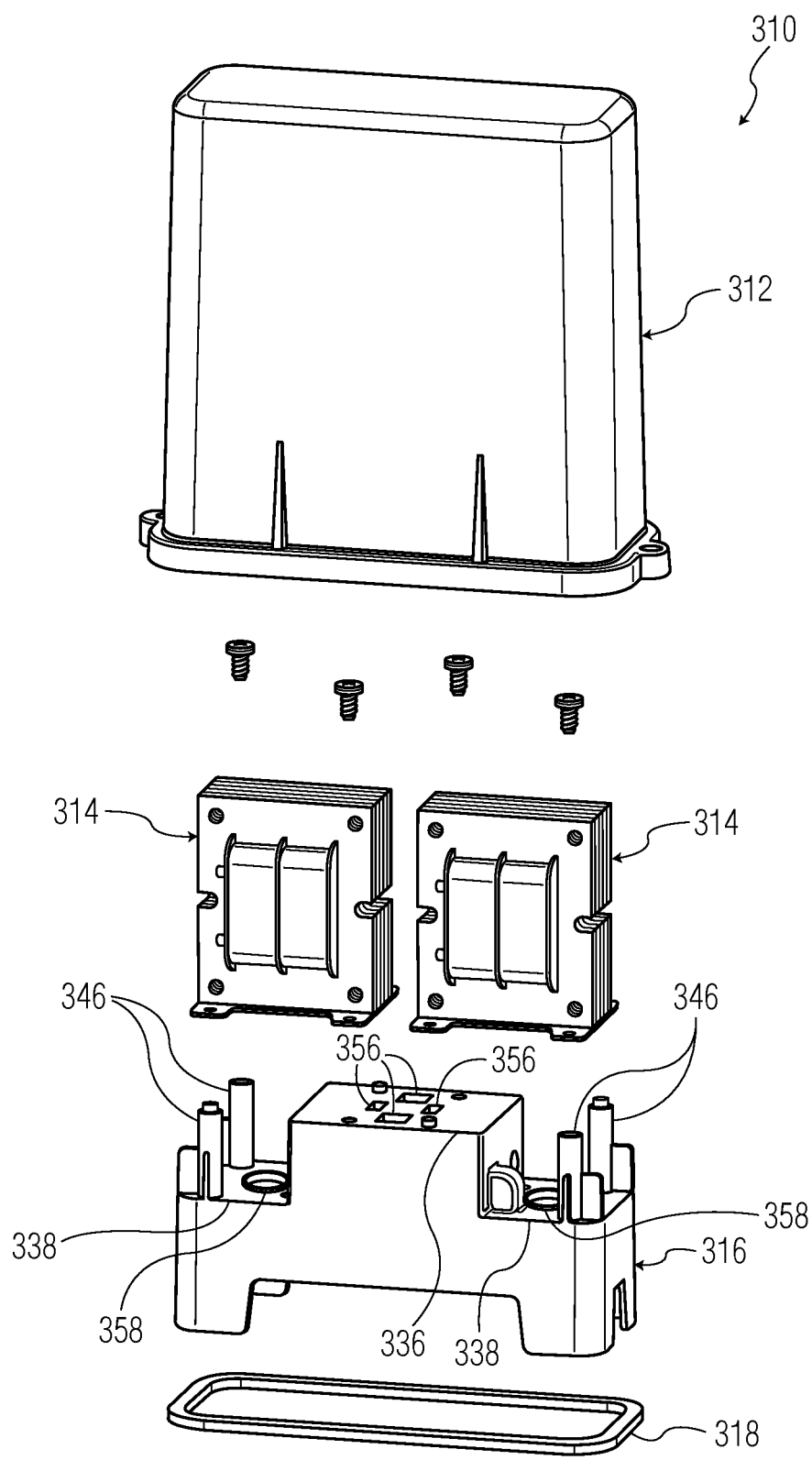
FIG. 4A is an exploded view of another embodiment of the electrical junction box of the present invention, wherein two isolation transformers are provided in a single housing.
Figure 4B:
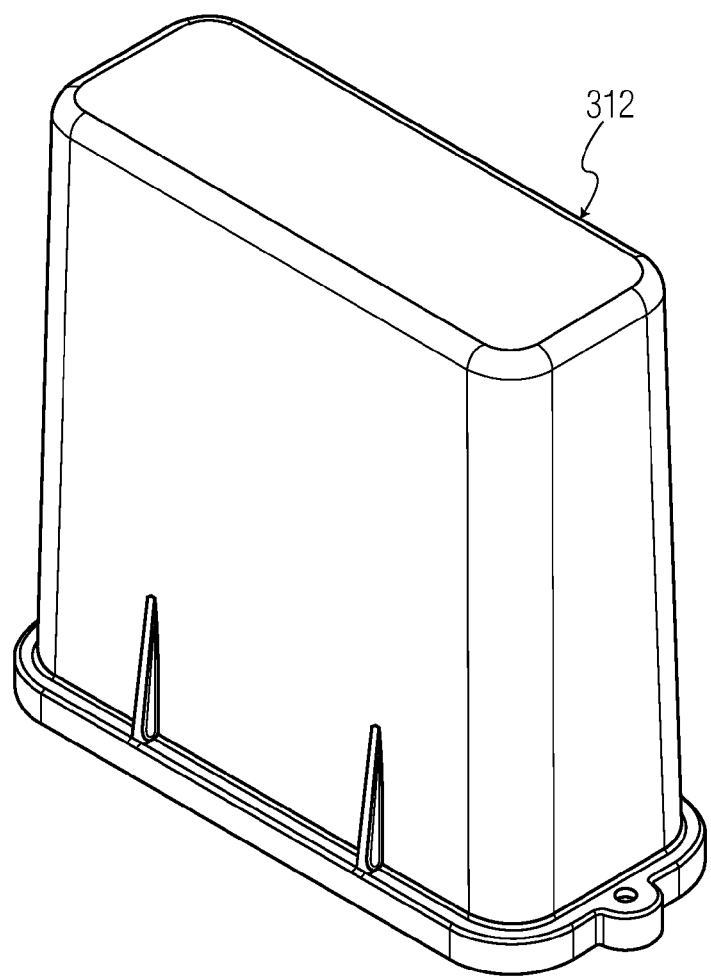
FIGS. 4B-4E are perspective, top, and side views respectively of the electrical junction box of FIG. 4A.
Figure 4C:
Figure 4D:
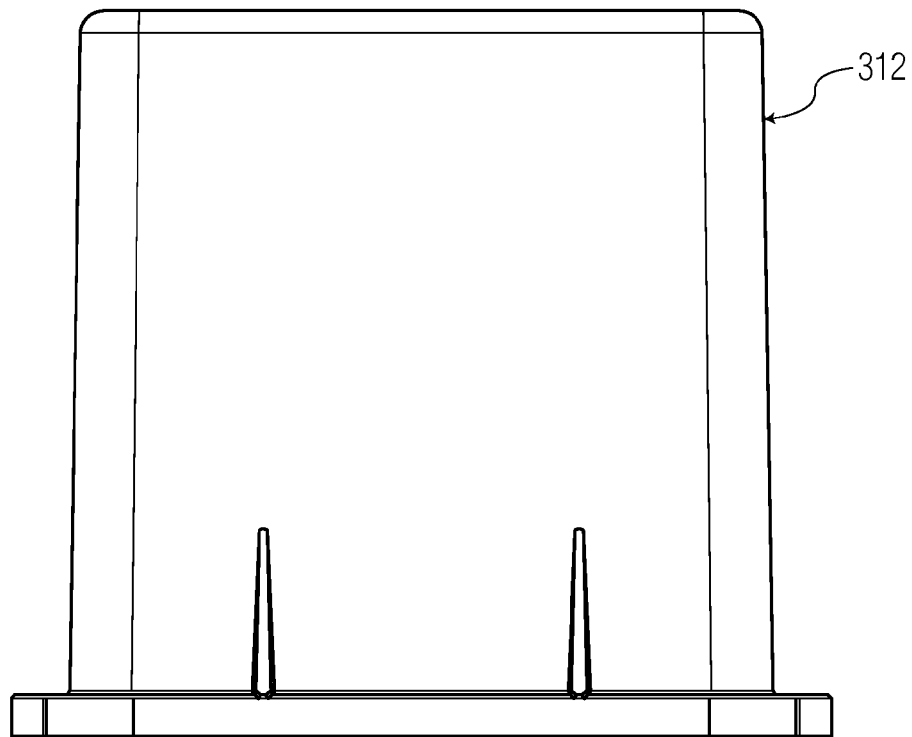
Figure 4E:
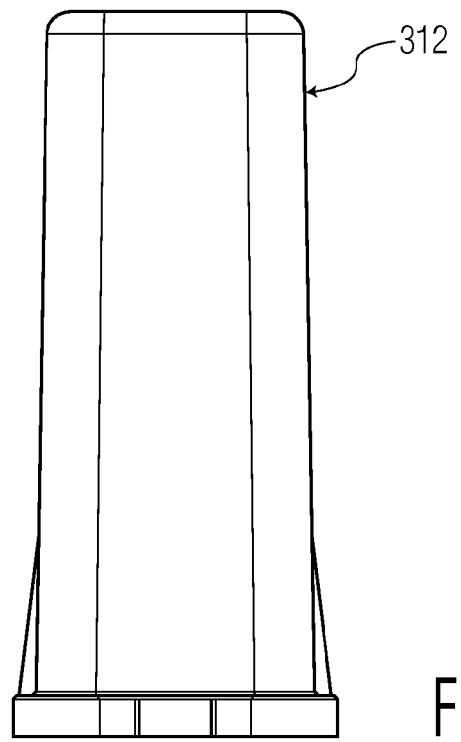

FIG. 4A is an exploded view of another embodiment of the electrical junction box 310 of the present invention, wherein two isolation transformers 314 are provided in a single housing. Advantageously, by providing two isolation transformers 314, a single junction box 310 can provide low-voltage power to two underwater lights. The junction box 310 includes a cover 312, an interior base portion 316, a gasket 318, and two or more transformers 314, which operate in the same manner as the previous embodiments. The transformers 314 include high-voltage and low-voltage terminals and wiring shown in FIGS. 1A-1B. The upper top surface 336 of the interior base portion 316 includes openings 356 to accommodate wiring for the low-voltage terminals of the two transformers 314, but it is noted that any number of openings could be provided. On opposite sides of the upper top surface 336 are lower top surfaces 338, each having a high-voltage opening 358 (through which high-voltage wiring extends from the respective transformer 314) and stand-offs 346 extending therefrom. The two transformers 314 rest on, and are secured to, the upper top surface 336 and the columns 346.

FIGS. 4B-4E are perspective, top, and side views, respectively, of the cover 312 of junction box 310 having a generally rectangular cross-sectional shape. As can be appreciated the shape of the cover 312 and its associated flange can be varied to accommodate baseplates of various configurations and/or from various manufacturers.

Figure 5:
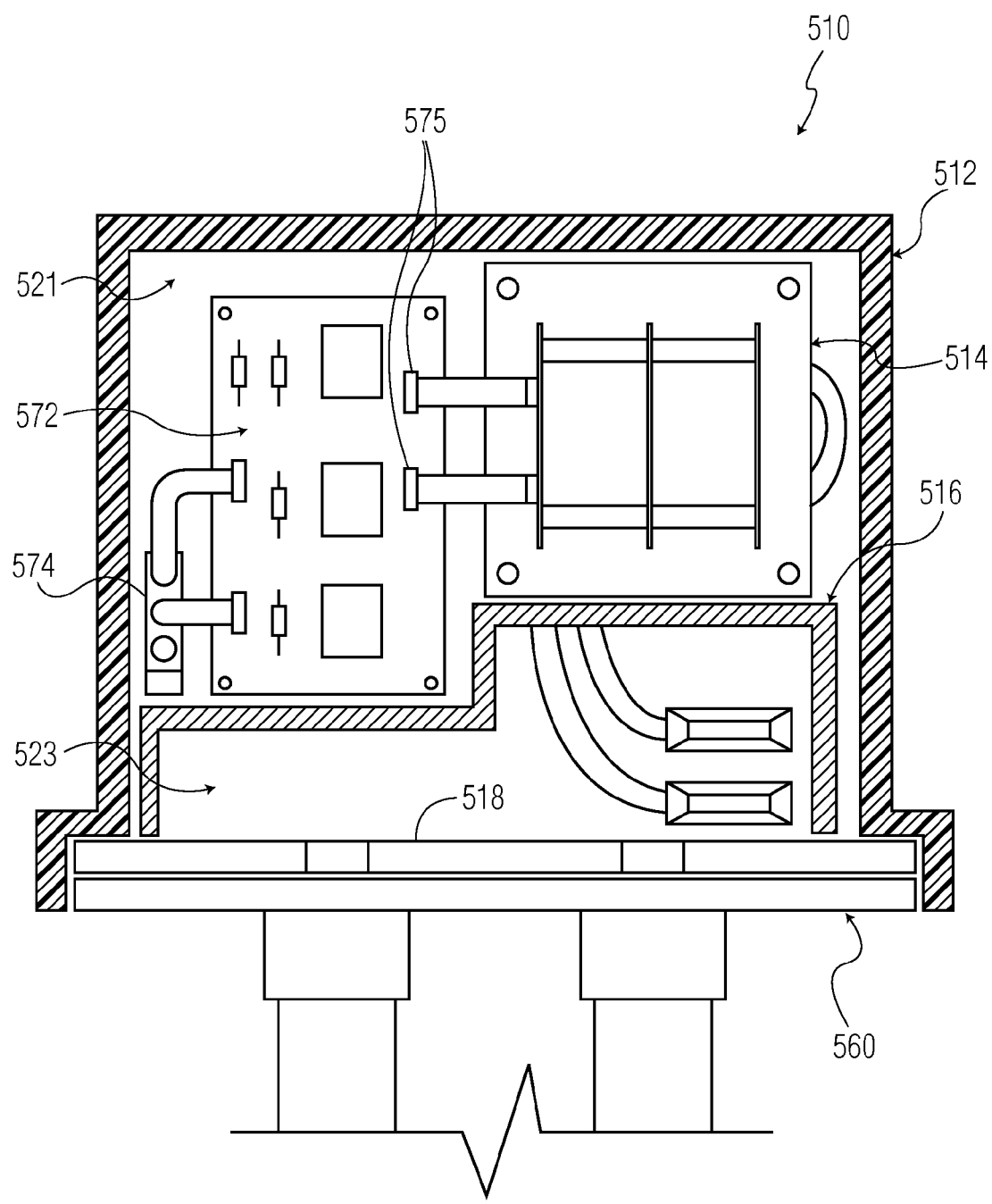
FIG. 5 is a partial cross-sectional view of an embodiment of the electrical junction box of the present invention including an electronic circuit board for controlling one or more components.

FIG. 5 is a partial cross-sectional view of an embodiment of the electrical junction box 510, which includes an electronic circuit board 572 (e.g., printed circuit board). As in the previous embodiments, the junction box 510 includes a cover 512, an isolation transformer 514, an interior base portion 516, a gasket 518, and a junction box baseplate 560. The transformer 514 is secured to the interior base portion 516, which separates an upper section or compartment 521 and a lower section or compartment 523, thereby physically and electrically isolating the two sections from each other. As shown, the junction box 510 could include an electronic circuit board 572, which could be used to control light fixtures (e.g., duration, timing, dimness, etc.), or other low-voltage electronic devices. Indeed, the circuit board 572 could include a programmable microprocessor (discussed below) for remotely controlling one or more pool or spa lights wired to the circuit board 572. For example, one or more programs could be executed by such a microprocessor for controlling colors and/or light intensities emitted by one or more underwater pool or spa lights to achieve a desired lighting effect/show. Still further, the circuit board 572 could be connected to one or more low-voltage landscaping lights, and could control colors and/or intensities emitted by such lights. Connectors 575 could connect the wires of the transformer 514 to the circuit board 572, and connectors 574 could connect the circuit board 572 to the light fixtures (or other electronic devices). The electronic circuit board 572 could be mounted in either the upper section 521 or the lower section 523, and by any suitable means (e.g., screws) and in any suitable configuration (e.g., mounted adjacent, above, or behind the transformer, mounted to the interior base portion or cover, etc.)

Figure 6:
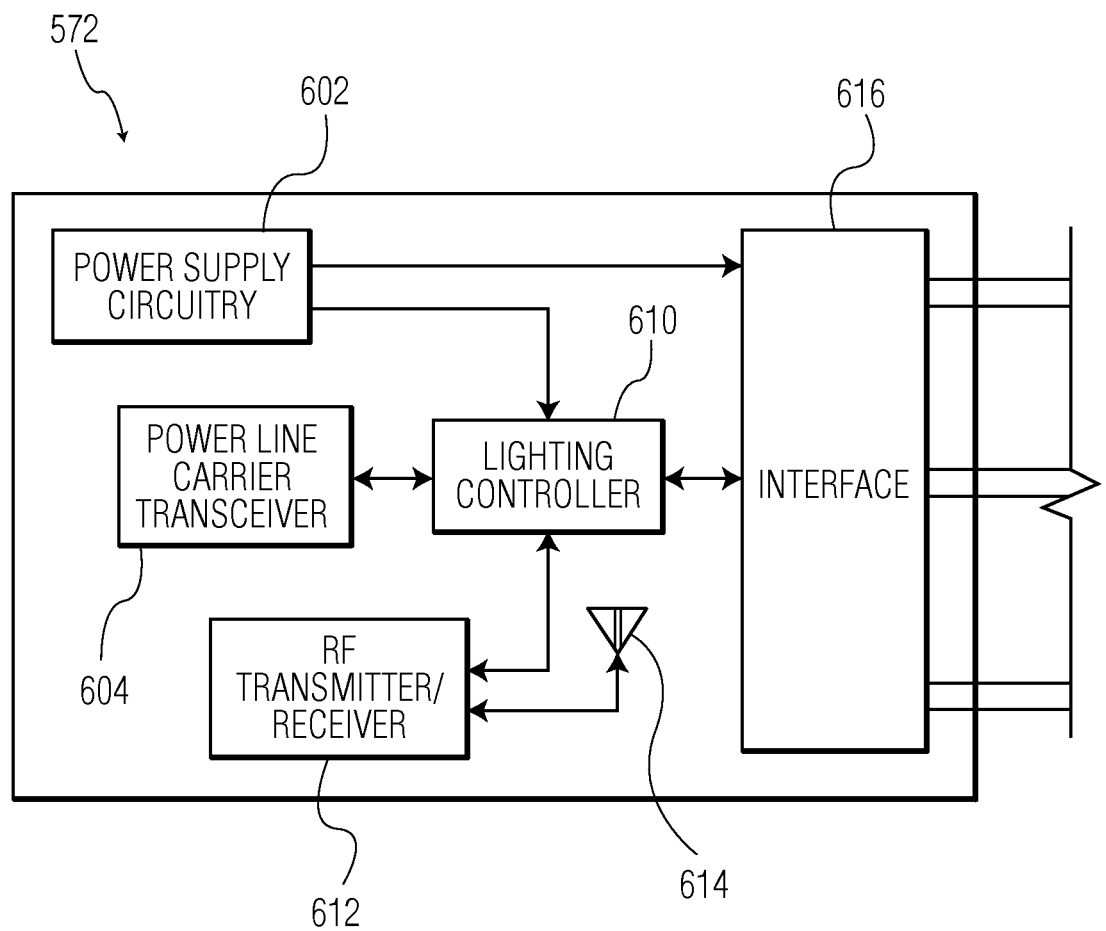
FIG. 6 is a block diagram of the electrical circuit board of FIG. 5.

FIG. 6 is a block diagram of the electronic circuit board 572 of FIG. 5. The circuit board 572 could include power supply circuitry 602 (e.g., switched mode power supply circuitry), which receives power input from the transformer 514 of FIG. 5, and distributes power to the other components of the circuit board 572. The circuit board 572 could also include a power line carrier transceiver 604, for receiving commands for remotely controlling one or more light fixtures as discussed above, which could be transmitted to the junction box over power lines connected thereto. Such commands could be issued (transmitted) by a central (pad-mounted) pool/spa system controller, or other device. The circuit board could also be in wireless communication with a remote device by incorporating an RF transmitter/receiver 612 in electrical communication with a lighting controller (microprocessor) 610 and an antenna 614. The circuit board could also receive commands by manual operation of the user, such as by a switch on the side of the junction box. A wiring interface 616 could connect the circuit board to external devices (e.g., lighting fixtures) to relay the commands from the lighting controller 610 to such devices.

Figure 7:
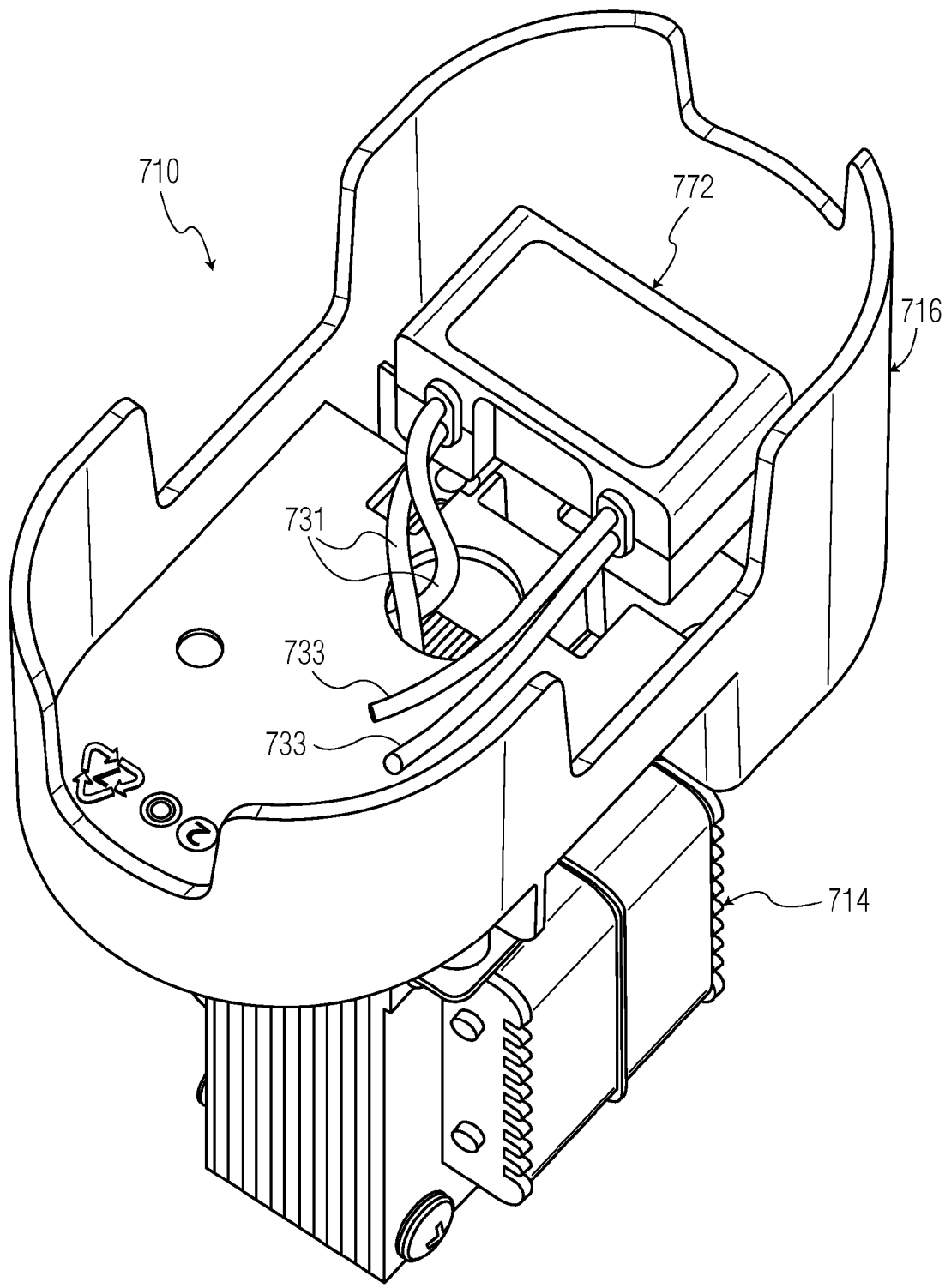
FIG. 7 is a bottom perspective view of another embodiment of the electrical junction box which includes a communications coupler.

FIG. 7 is a bottom perspective view (indicated at 710) of the electrical junction box, showing an optional communications coupler 772. The coupler 772 includes a transformer which is in electrical communication between high- and low-voltage power lines within the junction box, and transmits (couples) power line carrier control signals from the high-voltage power lines to the low-voltage power lines, so that such signals are then transmitted to one or more external devices (e.g., underwater lighting fixtures) for remotely controlling such devices. The coupler 772 is secured to the underside of the interior base portion 716, although it could be mounted in any of a variety of other suitable configurations and at different locations. The coupler 772 connects to low-voltage wires 731, and is also connected to high-voltage wires 733, as discussed in more detail below.

Figure 8:
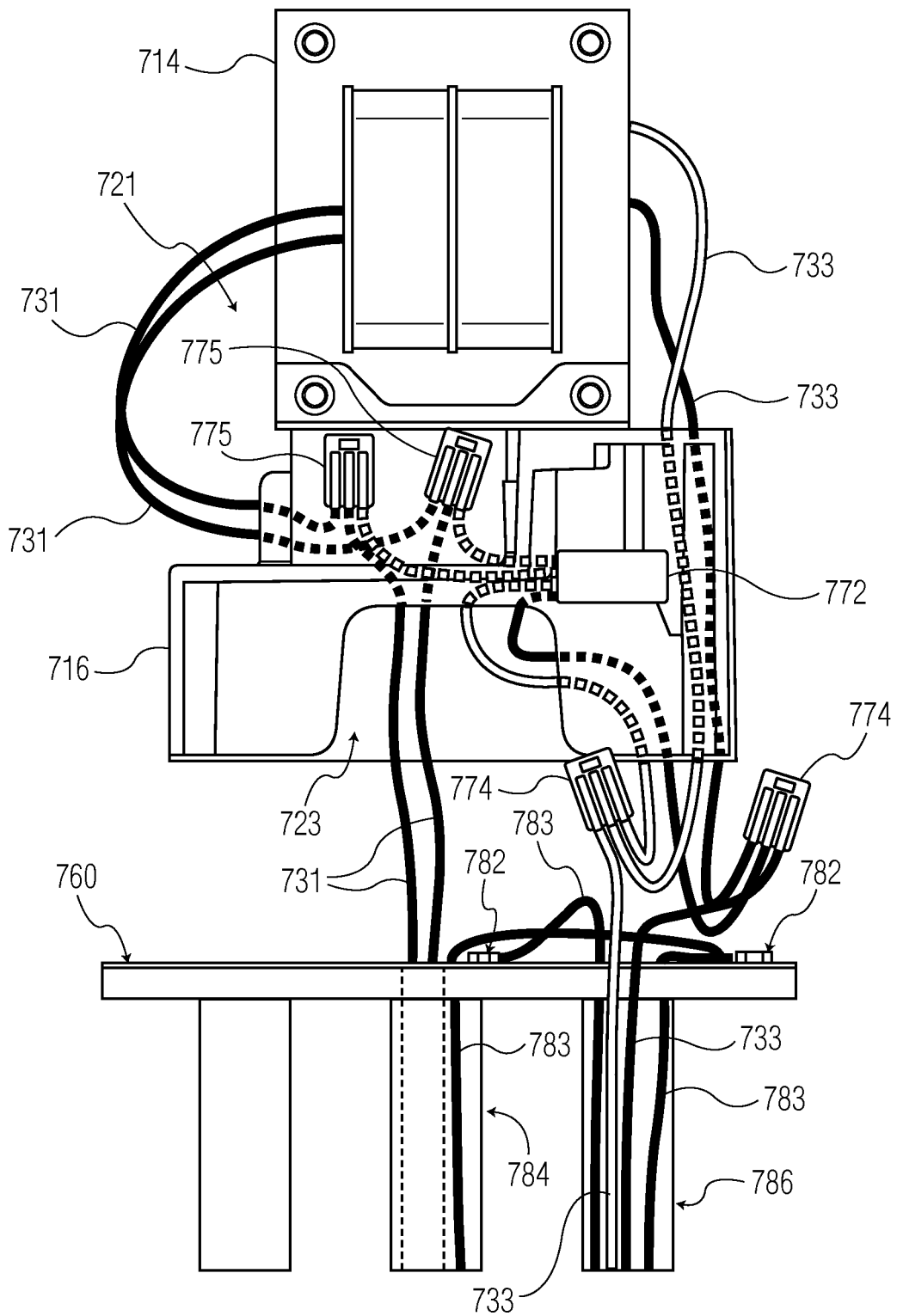
FIG. 8 is a diagram illustrating wiring of the components shown in FIG. 7.

FIG. 8 is a diagram showing wiring of the components shown in FIG. 7. Ground wires 783 are fed through a low-voltage conduit 784 and a high-voltage conduit 786, and secured to a baseplate 760 (bonded) using screws. The high-voltage wires 733 are fed through the high-voltage conduit 786, and then connected to both the coupler 772 and the transformer 714 via high-voltage connectors 774. The low-voltage wires 731 fed through the low-voltage conduit 784 are connected to the coupler 772 and transformer 714 via low-voltage connectors 775. The high-voltage connectors 774 are in the lower section or compartment 723 with the coupler 772. The low-voltage connectors 775 are in the upper section or compartment 721 with the transformer 714. Thus, the high-voltage connectors 774 are physically and electrically isolated from the low-voltage connectors 775 by the base portion 716.

The present invention could be used with a variety electronic devices (e.g., pool lighting fixtures, landscape lighting, etc.). Further, the junction box described herein could be interconnected with other junction boxes (e.g., in a "ganged" arrangement).

Having thus described the invention in detail, it is to be understood that the foregoing description is not intended to limit the spirit or scope thereof. What is desired to be protected is set forth in the following claims.

What is claimed is:
1. An electrical junction box, comprising:
   a cover removably attachable to a base plate of an existing junction box installation, the cover defining an interior cavity;
   a base portion coupled to the base plate, the base portion dividing the interior cavity of the cover to form a high-voltage section and a low-voltage section within the interior cavity of the cover, the high-voltage section isolated from the low-voltage section; and
   a transformer positioned within the interior cavity of the cover and mounted to the base portion, the transformer in electrical communication with high-voltage terminals and low-voltage terminals, the high-voltage terminals positioned in the high-voltage section and the low-voltage terminals positioned in the low-voltage section.
2. The electrical junction box of claim 1, wherein the cover and the base portion have generally rectangular, square, or oval cross-sectional shapes.

3. The electrical junction box of claim 1, further comprising a second transformer attached to the base portion.

4. The electrical junction box of claim 1, wherein the base portion further comprises an upper top surface having a first opening and a lower top surface having a second opening, and an inner sidewall connecting the upper and lower top surfaces.

5. The electrical junction box of claim 4, further comprising low-voltage wires connecting the transformer to the low-voltage terminals and high-voltage wires connecting the transformer to the high-voltage terminals.

6. The electrical junction box of claim 5, wherein the low-voltage wires extend through the first opening.

7. The electrical junction box of claim 6, wherein a second set of high-voltage wires extends through the second opening and is in electrical communication with the high-voltage terminals.

8. The electrical junction box of claim 1, wherein the base portion further comprises one or more stand-offs extending from a lower top surface to a height level with an upper top surface.

9. The electrical junction box of claim 8, wherein the transformer includes a plurality of mounting tabs, two of the plurality of mounting tabs attached to the stand-offs and two of the plurality of mounting tabs attached to the upper top surface of the base portion.

10. The electrical junction box of claim 1, further comprising a gasket configured to provide a watertight seal between the cover and the base plate.

11. The electrical junction box of claim 1, wherein the transformer comprises an isolation step-down transformer for providing low-voltage electrical power to an underwater pool or spa light.

12. The electrical junction box of claim 1, further comprising an electronic circuit board for controlling a device external to the junction box, the electronic circuit board positioned within the cover.

13. The electrical junction box of claim 1, further comprising a communications coupler positioned within the cover and in electrical communication with said high-voltage terminals and said low-voltage terminals, said communications coupler transmitting a power line carrier signal from said high voltage terminals to said low voltage terminals for a remote control device exterior to the junction box.

14. The electrical junction box of claim 13, wherein said communications coupler is positioned within said high-voltage section of said cover.

* * * * *